United States Patent
Yang et al.

[11] Patent Number: 6,103,541
[45] Date of Patent: Aug. 15, 2000

[54] ENCAPSULATION METHOD OF AN ORGANIC ELECTROLUMINESCENT DEVICE

[75] Inventors: Heng-Long Yang, Taipei Hsien; Chun-Hsun Chu, Chiai; Jui-Fen Pai, Nantou; Dao-Yang Huang, Taipei Hsien; Ching-Ian Chao, Hsinchu Hsien, all of Taiwan

[73] Assignee: Industrial Technology Research Institute, Hsinchu, Taiwan

[21] Appl. No.: 09/191,329

[22] Filed: Nov. 13, 1998

[30] Foreign Application Priority Data

Oct. 29, 1998 [TW] Taiwan ................................ 8711947

[51] Int. Cl.$^7$ .......................... H01L 21/00; H01L 21/44; H01L 21/48; H01L 21/50; H01L 21/469
[52] U.S. Cl. ................................ 438/26; 29/124; 29/608; 29/792
[58] Field of Search ................................ 438/26, 29, 124, 438/608, 792, FOR 384

[56] References Cited

U.S. PATENT DOCUMENTS 3,807,036  4/1974  Fischer .
5,458,735  10/1995  Richter et al. .
5,852,346  12/1998  Komoda et al. .

Primary Examiner—David E. Graybill
Attorney, Agent, or Firm—Jiawei Huang; J. C. Patents

[57] ABSTRACT

An encapsulation method of organic electroluminscence device is provided. An organic electroluminescent device is formed on an indium-tin-oxide glass substrate. A metal electrode is formed on the organic electroluminescent device. The organic electroluminescent device is encapsulated by a nitride layer or a carbide layer formed by using segmental sputtering at a low temperature. The substrate is soldered on a metal plate and covered by a metal cap.

19 Claims, 2 Drawing Sheets

ENCAPSULATION METHOD OF AN ORGANIC ELECTROLUMINESCENT DEVICE

CROSS-REFERENCE TO RELATED APPLICATION

This application claims the priority benefit of Taiwan application Ser. No. 87117947, filed Oct. 29, 1998, the full disclosure of which is incorporated herein by reference.

BACKGROUND OF THE INVENTION

1. Field of Invention

The invention relates in general to an encapsulation method of an organic electroluminescent (OEL) device, and more particularly to a method of encapsulating the OEL device by using nitride or carbide.

2. Description of Related Art

It has been over thirty years since the study of the OEL first started in the 1960s. In 1963, a research using a crystalline organic compound to illuminate by applying a voltage as high as 400 Volts was published. However, the intensity of the luminescence is too weak for the demand of application.

In 1987, Kodak Company announced an OEL device with a high intensity of luminescence. The practical application of the organic electroluminescent device thus causes a great interest and an intensive study in industry, government, and academia. The current development and research of the organic electroluminescent device are more directed towards the structure and material of the device.

One of the characteristics of an OEL device is using organic compound, such as tri-(8-hydroxyquinoline) aluminum ($Alq_3$), to form the luminescent layer. A hole injection layer is inserted between the luminescent layer and a cathode to increase the recombination efficiency of electrons and holes, so that an organic electroluminescence is obtained. With the characteristics including self-luminescence, wide visual angle (up to 160 degree), high response speed, low driving voltage, and true colors, the OEL is thought as the technology of plat panel display for the next generation. Currently, the development of OEL device almost reaches the stage of practical application stage. It is expected that the OEL can be applied to the flat panel display of the next generation. The planar luminescent device is greatly applied in true color planar display device, such as small display panel, outdoors display billboard, computer monitor, TV etc.

The organic film formed in the OEL device is very sensitive to moisture, oxygen and temperature. Moisture and oxygen deteriorate the structure of the material, while a high temperature destroys the conformation of the material. These three factors affect the lifetime of the OEL device seriously.

To prevent the lifetime of the OEL device from being shortened by moisture, oxygen, or high temperature, an encapsulation layer is formed.

FIG. 1 is the cross-sectional view of an OEL device after being encapsulated. An Indium-Tin-Oxide (ITO) layer 102 is formed on a glass substrate 100. An ITO glass substrate is thus formed by the ITO layer 102 and the substrate 100. An organic electroluminescent layer 104 is formed on the ITO layer 102 by thermal evaporation. A metal electrode 106 is formed on the OEL layer 104.

Epoxy resin is used as the encapsulation material. An epoxy resin layer 108 is formed along the periphery of the electroluminescent layer 104 and the electrode 106. A glass layer 110 is further formed to cover the top surface of the electrode 108 to accomplish the encapsulation process. The major drawback of the method as shown in FIG. 1 is the encapsulation can not isolate the electroluminescent device from being deteriorated by the penetration of oxygen and moisture.

In semiconductor manufacture, silicon nitride ($SiN_x$) is a commonly used dielectric material. Silicon nitride is often applied as a mask while etching or fabricating a filed oxide, or as a passivation layer for semiconductor packaging. Typically, a silicon nitride layer is deposited by plasma enhanced chemical vapor deposition (PECVD) at a reacting temperature range of 200 to 400° C. This temperature range is so high that the structure of the temperature-sensitive OEL layer is very likely to be damaged or destroyed. Therefore, silicon nitride made by PECVD at the above temperature cannot be applied as the encapsulation process for the OEL device. Silicon carbide has a very similar property to silicon nitride, thus, it is not a proper process for encapsulation of the OEL device at the above deposition temperature.

SUMMARY OF THE INVENTION

Accordingly, the present invention is to provide an encapsulation method. Using a low-temperature coating method, a silicon nitride thin film or a silicon carbide thin film is formed under a temperature sufficiently low to prevent from damaging the structure of the temperature-sensitive OEL material.

To achieve these and other advantages and in accordance with the purpose of the invention, as embodied and broadly described herein, the invention provides an encapsulation method for an OEL device. After the formation of the OEL device, a silicon nitride thin film or a silicon carbide thin film is formed by radio frequency (RF) segment sputtering to cover the OEL device. A metal plate and a metal cap are further soldered for a total encapsulation process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
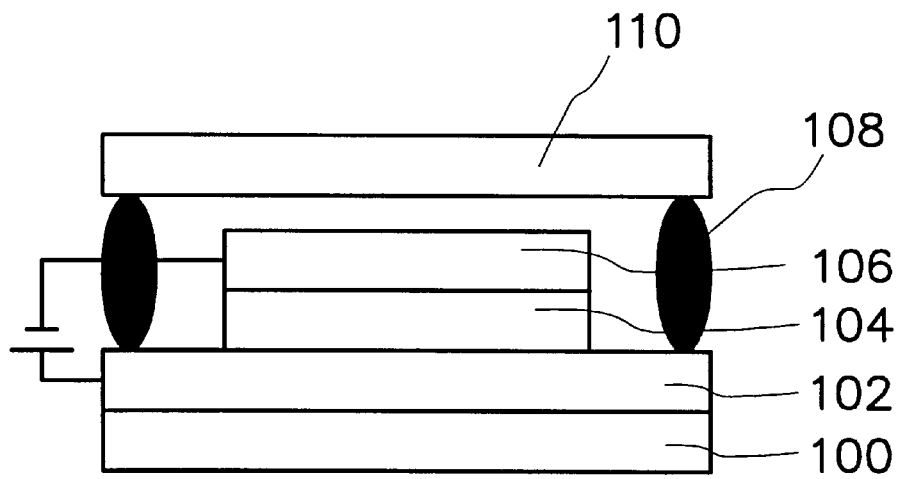
FIG. 1 is a schematic cross sectional view of the structure of an OEL device after being encapsulated according to the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2:
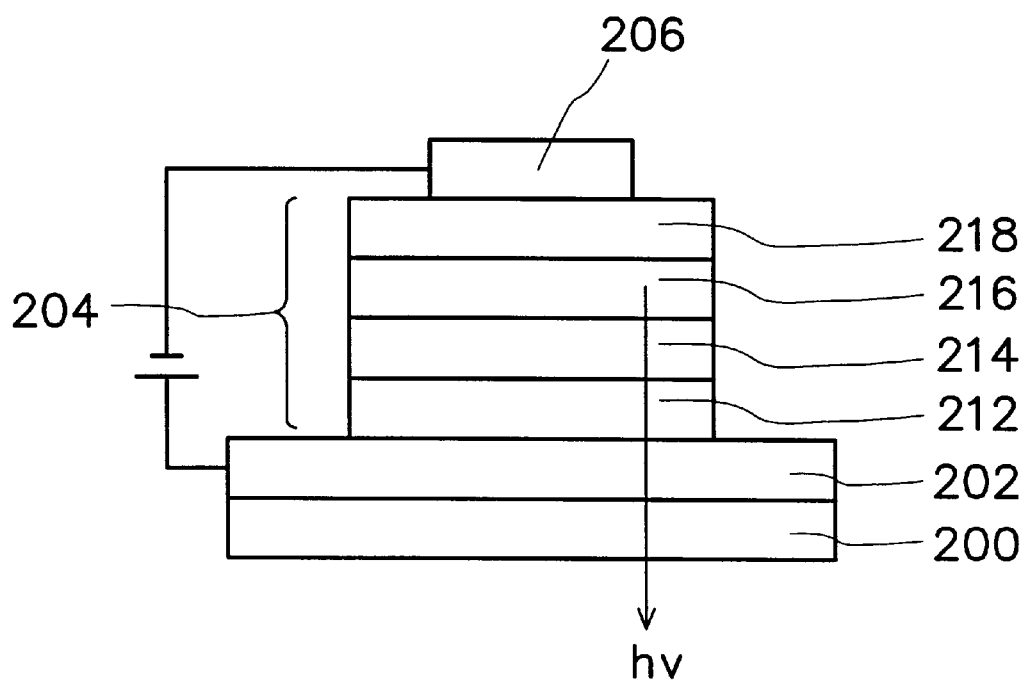
FIG. 2 is a schematic cross sectional view of an OEL device in a preferred embodiment according to this invention.

In FIG. 2, a schematic cross sectional view of an OEL device in a preferred embodiment according to this invention is shown. An ITO layer 202 is coated on a glass substrate 200 to form an ITO glass substrate. Several organic materials are coated on the ITO layer 202 as the organic electroluminescent layer 204. The OEL layer 204 further comprises at least a hole injection layer 212, a hole transport layer 214, a light-emitting layer 216, and electron transport layer 218. A metal electrode 206 is formed on the OEL layer 204. By applying a driving voltage between the electrode 206 and the ITO layer 202, an electroluminescence is generated.

Figure 3:
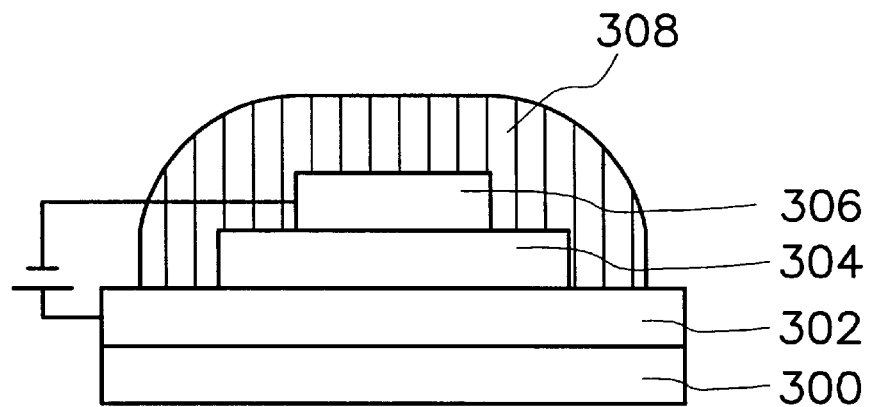
FIG. 3 is a schematic cross sectional view of an OEL device after the formation of an encapsulating layer in a preferred embodiment according to this invention.

In FIG. 3, which is the schematic cross sectional view of forming an encapsulation layer to cover an OEL device. A glass substrate 300 is provided. On the glass substrate 300, an ITO layer 302 is formed. The OEL layer 304 having a structure similar to the OEL layer 204 shown in FIG. 2 is formed on the ITO layer 302. After the formation of the OEL layer 304, a nitride thin film 308 is formed as an encapsulation layer to cover the electrode 306 and the OEL layer 304. In the invention, the nitride thin film 308 is formed by coating in vacuum at a low temperature such as a low-temperature vacuum sputtering method. Typically, a silicon nitride layer is selected as the nitride thin film 308 and formed with a thickness of about 0.05–0.5 $\mu$m. A RF segment sputtering is employed as the low-temperature vacuum sputtering. In this embodiment, the nitride layer 308 is formed by RF segment sputtering under the following conditions: an RF power of about 50 to 400 Watts, an operation pressure of about 1 to 50 mTorr, a gas flow ratio of nitrogen to argon ($N_2$/Ar) of about 0.1 to 30, a distance between a sputtering target and the OEL layer 304 of about 4 to 20 cm, and a temperature of about 70° C. As mentioned as above, in the conventional method, the encapsulation layer of nitride is formed at a temperature of about 200 to 400° C., and the structure of the OEL layer 104 (shown in FIG. 1) is easily damaged or even destroyed. In the invention, the operation temperature is as low as about 70° C., and thus, there is no worry that the temperature-sensitive OEL layer 304 is to be damaged by high temperature.

Figure 4:
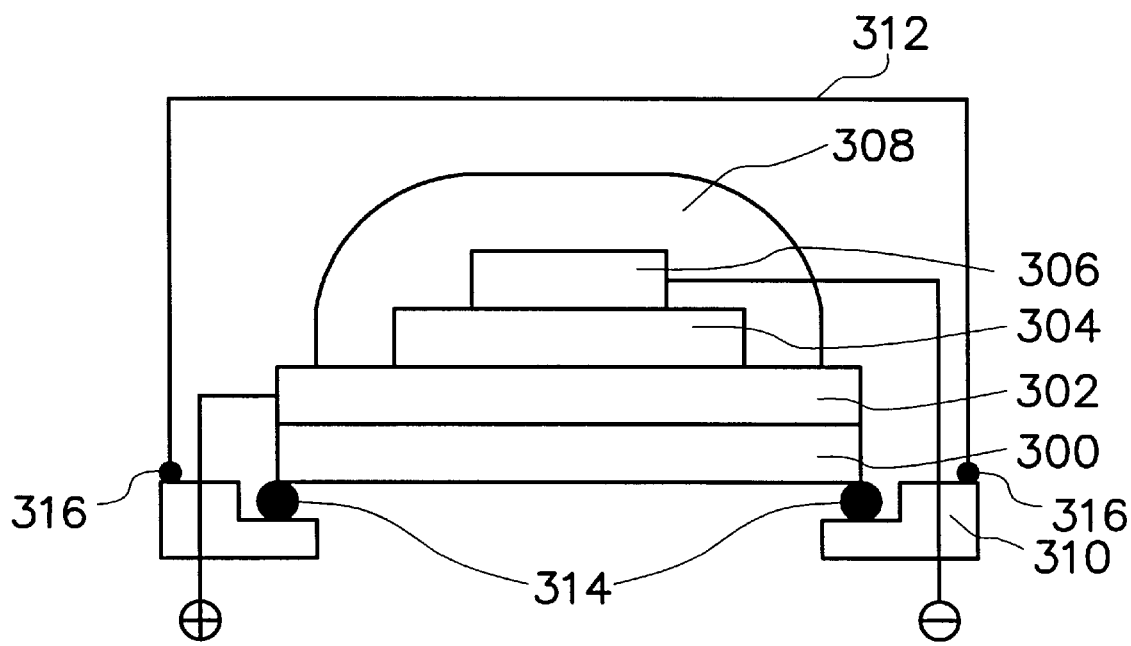
FIG. 4 is a schematic cross sectional view of OEL device after total encapsulating in a preferred embodiment according to this invention.

In FIG. 4, the substrate 300 is soldered at soldering points 314 on a metal plate 310. A metal cap 312 is then formed and soldered at another soldering point 316 on the metal plate 310. Therefore, the OEL device encapsulated by a nitride thin film 308 thereon is covered by the metal cap 312. As shown in the figure, the substrate 300 having a bottom surface exposed by a window through the metal plate 310. It is to be noted that whether the bottom surface of the substrate 300 is exposed is determined by a specific design and structure of the metal plate 310 as well as the requirement of the OEL device.

Alternatively, the nitride thin film 308 can be replaced by a carbide thin film to achieve the same objects and effects to protect the OEL layer 304 from being damaged at a high temperature, or deteriorated by moisture and oxygen. The carbide thin film is also formed with a thickness of about 0.05–0.5 $\mu$m by low-temperature vacuum sputtering. The conditions of the low-temperature vacuum sputtering includes an RF power of about 50 to 400 Watts, an operating pressure of about 1 to 50 mTorr, an operating temperature of about 70° C., a gas flow ratio of about 0.1 to 30 for methane to argon ($CH_4$/Ar). In addition, the distance between the sputtering target and the OEL layer 304 is about 4 to 20 cm. Again, the operating temperature is as low as about 70° C., so that while forming the carbide as an encapsulation layer, there is no worry that the OEL layer 304 is to be damaged.

In addition to the materials of nitride and carbide mentioned as above, it is appreciated that people skilled in the art may adapt other material which has similar property in protecting the OEL device to form the encapsulation layer.

In a very common prior technique, epoxy resin is used as the material for forming an encapsulation layer, followed by forming a glass cap to cover the whole structure. The OEL device encapsulated therein is easily affected or damaged by the existence of moisture and oxygen since epoxy resin cannot effectively block the penetration of moisture and oxygen. As a consequence, the reliability of the OEL device is poor and the lifetime is shortened. In the invention, nitride or carbide material used to form the encapsulation layer effectively insulate the OEL device from being deteriorated by moisture and oxygen. Moreover, the encapsulation process is performed under a vacuum environment, so that there is little moisture and oxygen in the existent fabrication process. Therefore, either during the process of forming an encapsulation layer, or after the formation of the encapsulation layer, the OEL device is well protected from being deteriorated by moisture and oxygen.

Moreover, the nitride thin film or carbide thin film is formed at a temperature as low as about 70° C., thus, the material can be applied to the OEL device which is very temperature-sensitive without damaging the OEL material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An encapsulation method of an organic electroluminescent device, comprising the steps of:

providing a glass substrate;

forming an indium tin oxide layer on the glass substrate;

forming the organic electroluminescent layer on the indium tin oxide layer;

forming an electrode on the organic electroluminescent layer;

encapsulating the organic electroluminescent layer and the electrode by forming a nitride layer in a vacuum environment at an operating temperature at which the organic electroluminescent layer is not damaged;

soldering the substrate on a metal plate; and covering the electrode and the organic electroluminescent layer by a metal cap.

2. The method of claim 1, wherein the step of forming the organic electroluminescent layer comprising the steps of:

forming a hole injection layer on the indium tin oxide layer;

forming a hole transport layer on the hole injection layer;

forming a light emitting layer on the hole transport layer; and forming an electron transport layer on the light emitting layer.

3. The method of claim 1, wherein the operating temperature is at about 70° C.

4. The method of claim 1 wherein the nitride layer is formed by using low-temperature vacuum sputtering.

5. The method of claim 4, wherein the low-temperature vacuum sputtering is performed under:

a radio frequency power of about 50 to 400 Watts;

an operating pressure ranged from about 1 to 50 mTorr;

a gas flow ratio of nitrogen to argon of about 0.1 to 30; and a distance between a sputtering target to the organic electroluminescent layer of about 4 to 20 cm.

6. The method of claim 1, wherein the nitride layer includes a silicon nitride layer.

7. The method of claim 1, wherein the nitride layer has a thickness range of about 0.05–0.5 µm.

8. An encapsulation method of an organic electroluminescent device, comprising the steps of:

providing a glass substrate;

forming an indium tin oxide layer on the glass substrate;

forming the organic electroluminescent layer on the indium tin oxide layer;

forming an electrode on the organic electroluminescent layer;

encapsulating the organic electroluminescent layer and the electrode by forming a carbide layer in a vacuum environment at an operating temperature at which the organic electroluminescent layer is not damaged;

soldering the substrate on a metal plate; and covering the electrode and the organic electroluminescent layer by a metal cap.

9. The method of claim 8, wherein the operating temperature is at about 70° C.

10. The method of claim 8, wherein the carbide layer is formed by using low-temperature vacuum sputtering under the conditions of:

a radio frequency power of about 50 to 400 Watts;

an operating pressure ranged from about 1 to 50 mTorr;

a gas flow ratio of methane to argon of about 0.1 to 30; and a distance between a sputtering target to the organic electroluminescent layer of about 4 to 20 cm.

11. The method of claim 8, wherein the carbide layer has a thickness range of about 0.05–0.5 µm.

12. A method of encapsulating an organic electroluminescent layer formed on an indium tin oxide glass, comprising the steps of:

offering a vacuum environment; and forming an encapsulation layer on the organic electroluminescent device at an operating temperature at which the organic electroluminescent layer is not damaged.

13. The method of claim 12, wherein the organic electroluminescent layer has an electrode formed thereon.

14. The method of claim 12, wherein the organic electroluminescent layer comprises:

a hole injection layer;

a hole transport layer;

a light emitting layer on the hole injection layer; and an electron transport layer on the light emitting layer.

15. The method of claim 12, wherein the operating temperature is at about 70° C.

16. The method of claim 12, wherein the encapsulation layer is formed using low-temperature vacuum sputtering.

17. The method of claim 12, wherein encapsulation layer includes a nitride layer formed by the low-temperature vacuum sputtering under:

a radio frequency power of about 50 to 400 Watst;

an operating pressure ranged from about 1 to 50 mTorr;

a gas flow ratio of nitrogen to argon of about 0.1 to 30; and a distance between a sputtering target to the organic electroluminescent layer of about 4 to 20 cm.

18. The method of claim 12, wherein encapsulation layer includes a carbide layer formed by the low-temperature vacuum sputtering under:

a radio frequency power of about 50 to 400 Watts;

an operating pressure ranged from about 1 to 50 mTorr;

a gas flow ratio of methane to argon of about 0.1 to 30; and a distance between a sputtering target to the organic electroluminescent layer of about 4 to 20 cm.

19. The method of claim 12, wherein the encapsulation layer has a thickness range of about 0.05–0.5 µm.

* * * * *